US008659318B1

(12) United States Patent
Gordon et al.

(10) Patent No.: US 8,659,318 B1
(45) Date of Patent: Feb. 25, 2014

(54) SYSTEMS AND METHODS FOR IMPLEMENTING TRISTATE SIGNALING BY USING ENCAPSULATED UNIDIRECTIONAL SIGNALS

(75) Inventors: Brandon Lewis Gordon, Scotts Valley, CA (US); Kent Orthner, Santa Cruz, CA (US); Aaron Ferrucci, Santa Cruz, CA (US); David Van Brink, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/889,735

(22) Filed: Sep. 24, 2010

(51) Int. Cl.
*H03K 19/00* (2006.01)
*H03K 19/0175* (2006.01)

(52) U.S. Cl.
USPC .................................. 326/82; 326/56; 326/86

(58) Field of Classification Search
USPC ............................................... 326/56, 82–87
See application file for complete search history.

(56) References Cited

U.S. PATENT DOCUMENTS

| 3,912,947 | A | * | 10/1975 | Buchanan | 326/57 |
| 5,418,933 | A | | 5/1995 | Kimura et al. | |
| 6,121,814 | A | * | 9/2000 | Henry | 327/291 |
| 6,388,467 | B1 | * | 5/2002 | Ward et al. | 326/56 |
| 6,870,397 | B1 | * | 3/2005 | Fox et al. | 326/41 |
| 7,587,537 | B1 | * | 9/2009 | Burney | 710/71 |
| 2006/0267632 | A1 | * | 11/2006 | Schwarz | 326/82 |
| 2007/0139076 | A1 | * | 6/2007 | Chambers | 326/56 |

OTHER PUBLICATIONS

Ouyang, D. and Silberg, J., "Synthetic Biology: Engineering Biological Systems" Catalyst: Rice Undergraduate Science Review, from: Snapshots in Research, vol. 2, Spring 2009, [retrieved from internet Sep. 7, 2010] http://catalyst.rice.edu/archives/43 6 pages.
Zimmerman, A., Aug. 9, 2006, "Optical Transistors" Andrew's Physics Blog [retrieved from internet Sep. 7, 2010] http://physics.about.com/b/2006/08/09/optical-transistors.htm 2 pages.
Marquit, M., Feb. 18, 2010, "Can graphene nanoribbons replace silicon?" [retrieved from internet Sep. 7, 2010] http://www.physorg.com/news185701353.html 10 pages.
Messina, J., Feb. 3, 2010, "Carbon Based Chips May One Day Replace Silicon Transistors" [retrieved from internet Sep. 7, 2010] http://www.physorg.com/news184420861.html 11 pages.
Danneau, R., Apr. 20, 2007 "Graphene nanoribbons" Graphene project meeting, Nano Group, Low Temperature Laboratory, Helsinki University of Technology, 11 pages.

* cited by examiner

*Primary Examiner* — Thienvu Tran
(74) *Attorney, Agent, or Firm* — Weaver Austin Villeneuve & Sampson LLP

(57) ABSTRACT

Systems and methods for implementing tristate signaling are described. The systems include an integrated circuit that further includes a tristate system. The tristate system converts an encapsulated unidirectional signal into a tristate signal. A relation between multiple unidirectional signals and the tristate signal is established by encapsulating the unidirectional signals to represent the tristate signal. The establishment of the relation facilitates control of the tristate signal by controlling the encapsulated unidirectional signals.

22 Claims, 10 Drawing Sheets

US 8,659,318 B1

SYSTEMS AND METHODS FOR IMPLEMENTING TRISTATE SIGNALING BY USING ENCAPSULATED UNIDIRECTIONAL SIGNALS

FIELD OF THE INVENTION

The present disclosure generally relates to integrated circuits and other devices of that general type. More particularly, the present disclosure relates to systems and methods for implementing tristate signaling by using encapsulated unidirectional signals.

BACKGROUND

An integrated circuit (IC) has a plurality of functional blocks including a central processing unit (CPU) block. A data bus of the CPU is directly connected to input/output terminals of the composite IC. The output terminal is used for outputting a read signal through a buffer to a memory.

To a certain extent, a user may be able to manipulate a maximum frequency of the integrated circuit. However, the user may not have control of a signal communicated between the IC and the memory.

SUMMARY OF THE INVENTION

Systems and methods for implementing tristate signaling are described. The systems include an integrated circuit. The integrated circuit includes a tristate system that converts a collection of encapsulated unidirectional signals into a tristate signal.

Most integrated circuits use unidirectional signals to communicate between components of the integrated circuit. The integrated circuits communicate with an off-chip device via a tristate signal.

It is useful to determine a relation between the unidirectional signals and the tristate signal. Such a relation is established by encapsulating the unidirectional signals to represent the tristate signal. The establishment of the relation allows the user to control the tristate signal by controlling the encapsulated unidirectional signals. Moreover, the control of the tristate signal allows the user to control a communication between the integrated circuit and the off-chip device.

BRIEF DESCRIPTION OF THE DRAWINGS

The systems and techniques may best be understood by reference to the following description taken in conjunction with the accompanying drawings, which illustrate specific embodiments of the present invention.

DETAILED DESCRIPTION

Figure 1:
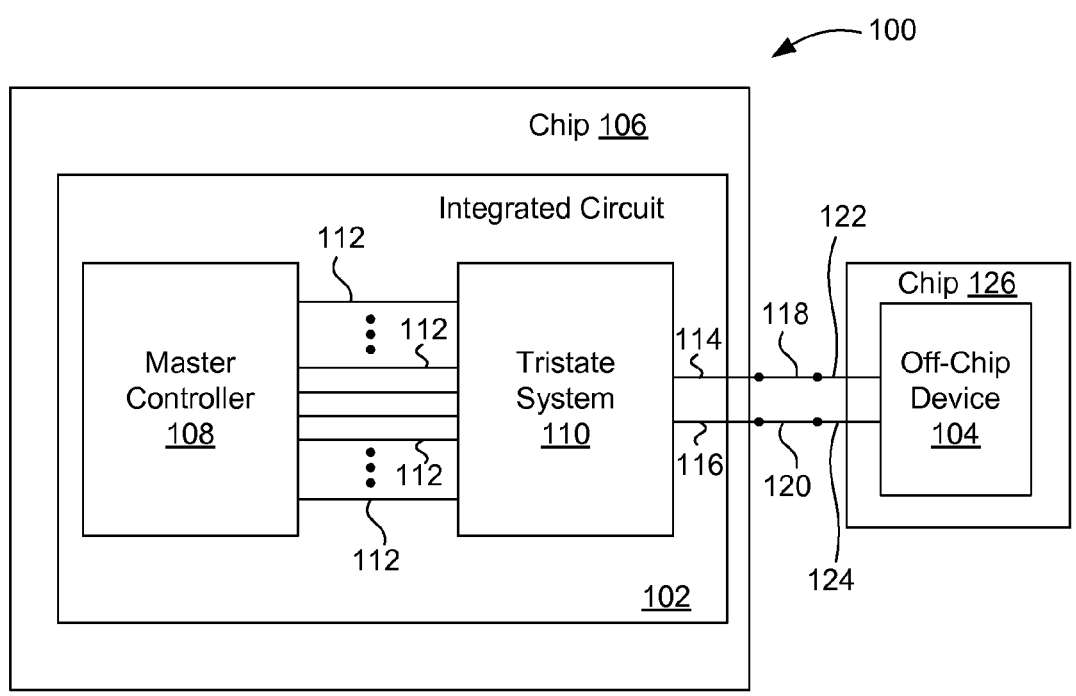
FIG. 1 is a block diagram of an embodiment of a system for implementing tristate signaling.

FIG. 1 is a block diagram of an embodiment of a system 100 for implementing tristate signaling. System 100 includes an integrated circuit 102 and an off-chip device 104. Examples of off-chip device 104 may be an off-chip memory or an off-chip Ethernet device. Integrated circuit 102 may be an application specific integrated circuit (ASIC) or a programmable logic device (PLD), such as a field programmable gate array (FPGA). Integrated circuit 102 is embedded on a chip 106, and includes a master controller 108 and a tristate system 110. It is noted that tristate system 110 is not a tristate gate. Chip 106 includes a semiconductor substrate or a non-semiconductor substrate, such as a substrate that uses photons instead of electrons, a semimetal substrate, or a substrate used in a genetic circuit. All components of integrated circuit 102 are on-chip, which means on chip 106, and not off-chip. Master controller 108 is connected to tristate system 110 via multiple unidirectional links 112 and tristate system 110 is connected to off-chip device 104 via a pin 114 and a pin 116. Each pin 114 and 116 may be a unidirectional pin or a tristate pin. A tristate pin is a bidirectional pin. Each pin 114 and 116 extends from chip 106 and is a bidirectional physical pin that communicates signals in two opposite directions. Unidirectional link 112 can communicate only in one direction. Unidirectional link 112 may be an embedded conductor within chip 106. Multiple links 118 and 120 connecting pins 114 and 116 to multiple pins 122 and 124 of off-chip device 104 are conductors of a bus, which may be a flexible flat cable or conductors of a nonflat, such as round, cable. Each pin 122 and 124 is a pin that extends from chip 126.

Off-chip device 104 is not embedded within integrated circuit 102 and is located on a chip 126 separate from chip 106. For example, a substrate of chip 126 is separate from the substrate of chip 106.

Unidirectional links 112 communicate unidirectional signals in a protocol compatible with master controller 108. Examples of a protocol compatible with master controller 108 include an advanced high performance bus (AHB™) specification developed by ARM™ corporation, an advanced microcontroller bus architecture (AMBA) advanced extensible interface (AXI) specification developed by ARM™ corporation, an Avalon™ specification developed by Altera™ corporation, or a MicroBlaze™ bus specification developed by Xilinx™ corporation.

An example of master controller 108 includes a NIOS II™ processor available from Altera™ corporation, a processor that uses Avalon™ switching fabric as an interface to apply the Avalon™ specification, a MicroBlaze™ processor available from Xilinx™ corporation, or an ARM™ processor that uses an AHB interface to apply the AHB specification. Examples of off-chip device 104 include a read-only memory (ROM) and a random access memory (RAM). Examples of RAM include a dynamic RAM (DRAM) and a static RAM (SRAM). Examples of ROM include an erasable programmable ROM (EPROM) and an electronically erasable programmable ROM (EEPROM). Other examples of off-chip device 104 include a hard disk.

Integrated circuit 102 is connected to off-chip device 104 via pin 114 that communicates an input signal or an output signal at a time. Tristate system 110 communicates with off-chip device 104 via a tristate signal or a unidirectional signal communicated over pin 114. For example, tristate system 110 receives via pin 114 an input signal from off-chip device 104 and sends an output signal to off-chip device 104. In this example, tristate system 110 communicates via pin 114 the output signal if an output enable signal is asserted by a component, such as master controller 108. Moreover, in this example, tristate system 110 sends the output signal to off-chip device 104 via pin 114 if an output enable signal is asserted and does not send the output signal to off-chip device 104 if the output enable signal is not asserted by the component. Further, in this example, if the output enable signal is not asserted, tristate system 110 receives an input signal if the input signal is sent by off-chip device 104.

Each unidirectional link 112 communicates a unidirectional signal, such as an input signal received by master controller 108 from tristate system 110 or an output signal communicated by master controller 108 to tristate system 110. For example, unidirectional link 112 communicates either an input signal input to master controller 108 or an output signal output from master controller 108. In this example, unidirectional link 112 communicates the output signal if an output enable signal is provided, as described below.

Master controller 108 generates and sends, via unidirectional links 112, a user command, such as a read user command to perform a read transaction or a write user command to perform a write transaction, to tristate system 110. During the read transaction, data is read from off-chip device 104 and during the write transaction, data is written to off-chip device 104. Tristate system 110 receives the user command and converts the user command into multiple encapsulated unidirectional signals, such as, control, address, and data signals. Read and write signals are examples of control signals. All components of tristate system 110 communicate with each other via unidirectional signals.

Tristate system 110 further converts multiple encapsulated unidirectional signals into one or more tristate signals and sends the one or more tristate signals via pin 114, link 118, and pin 122 to off-chip device 104. An example of a tristate signal includes a data signal representing data that is to be written to off-chip device 104 via pin 114, link 118, and pin 122 or read from off-chip device 104 via pin 114, link 118, and pin 122, and the data is written to off-chip device 104 if an output enable signal is asserted by a component, such as master controller 108, of integrated circuit 102.

In another embodiment, system 100 includes more than one off-chip device 104. In yet another embodiment, system 100 includes more than one integrated circuit 102. In an alternative embodiment, off-chip device 104 is replaced with an on-chip device that is located on chip 106. Examples of the on-chip device may be a memory device or an Ethernet device.

In still another embodiment, tristate system 110 is connected to off-chip device 104 via any number of tristate or unidirectional pins of a bus. The bus includes more than two pins 114 and 116. The pins of the bus can be used between integrated circuit 102 and off-chip device 104 and each of the pins of the bus communicates a tristate or a unidirectional signal.

Figure 2:
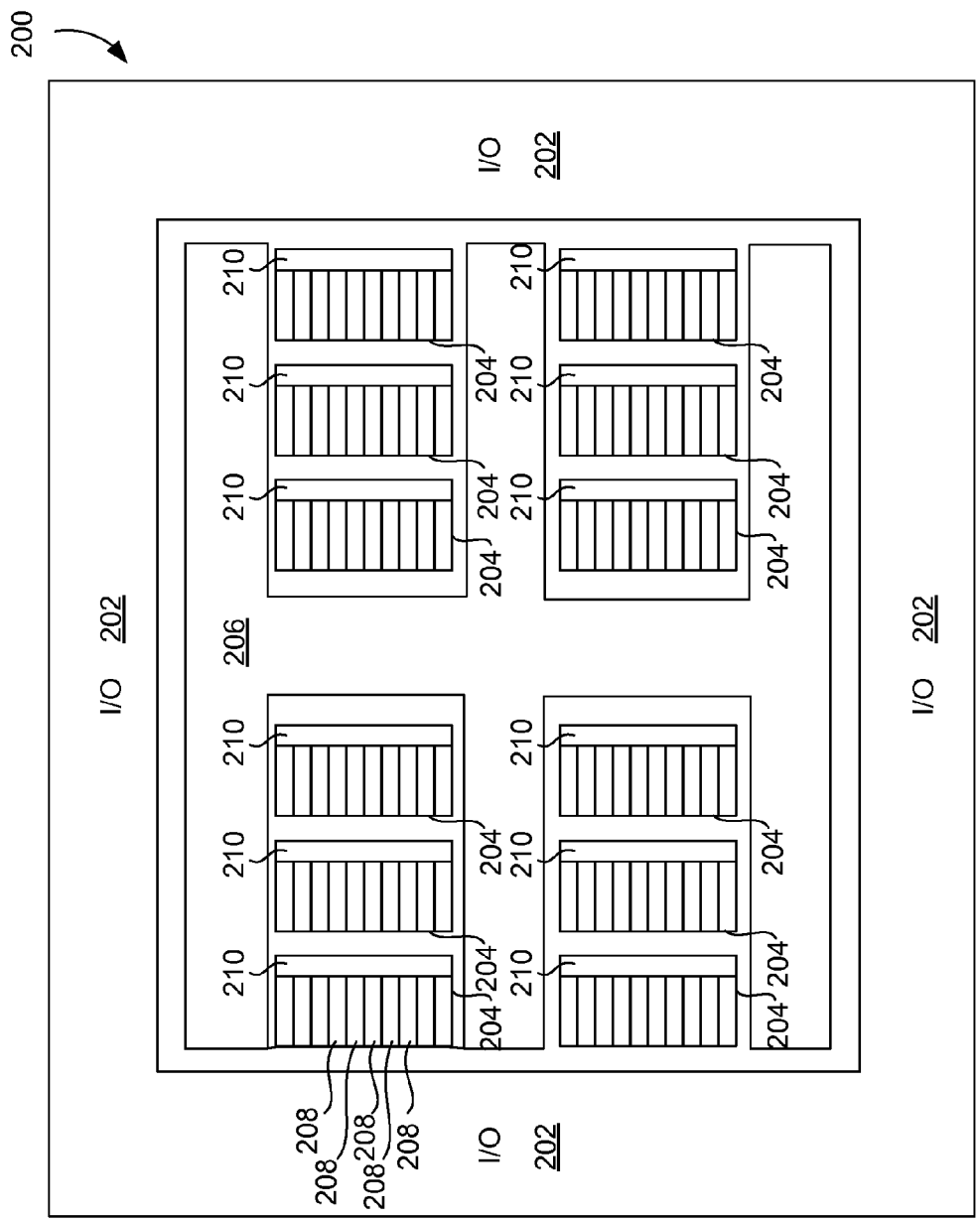
FIG. 2 is a block diagram of an embodiment of a programmable logic device (PLD) in which an integrated circuit of the system of FIG. 1 is implemented.

FIG. 2 is a block diagram of an embodiment of a PLD 200, which is an example of integrated circuit 100. Each of master controller 108 and tristate system 110 are integrated within PLD 200. PLD 200 includes a plurality of input/output (I/O) devices 202 and a plurality of logic array blocks (LABs) 204 connected to the I/O devices 202. Each I/O device 202 may be an I/O register. One LAB 204 is connected to another LAB 204 via programmable routing and one or more LAB lines 206.

Each LAB 204 includes a plurality of logic elements (LEs) 208, which can be implemented as memory or logic. Each LE 208 can be flexibly configured to include one or more lookup tables (LUTs). LEs 208 are connected via a plurality of local lines 210.

Figure 3:
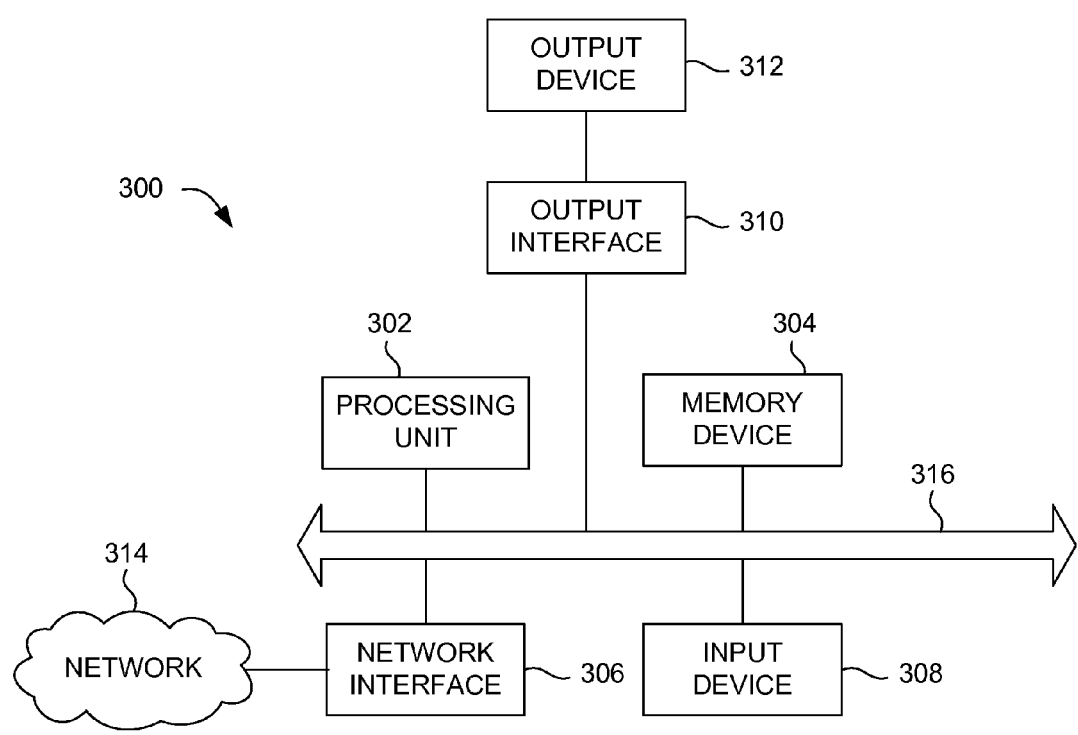
FIG. 3 is a block diagram of a system that is used to generate a design of the PLD.

FIG. 3 is a block diagram of a system 300 that is used to generate a design of PLD 200 (FIG. 2). System 300 includes a processing unit 302, a memory device 304, a network interface 306, an input device 308, an output interface 310, and an output device 312. System 300 is an exemplary computing device. For example, system 300 may be a computer, such as a personal computer, a desktop, or a laptop.

Processing unit 302 may be a central processing unit (CPU), the processor, a microprocessor, a hardware controller, a microcontroller, a programmable logic device programmed for use as a controller, a network controller, or other processing unit. Memory device 304 may be a RAM, a ROM, or a combination of RAM and ROM. For example, memory device 304 includes a computer-readable medium, such as a floppy disk, a ZIP™ disk, a magnetic disk, a hard disk, a compact disc-ROM (CD-ROM), a recordable CD, a digital video disc (DVD), or a flash memory. Memory device 304 stores a System on Programmable Chip (SOPC) Builder, which may be a Quartus Systems (QSYS™) Editor, for designing PLD 200.

Network interface 306 may be a modem or a network interface card (NIC) that allows processing unit 302 to communicate with a network 314, such as a wide area network (WAN) or a local area network (LAN). Processing unit 302 may be connected via a wireless connection or a wired connection to network 314. Examples of the wireless connection include a connection using Wi-Fi protocol or a WiMax protocol. The Wi-Fi protocol may be an IEEE 802.11, IEEE 802.11a, IEEE 802.11b, IEEE 802.11g, or IEEE 802.11i protocol. Examples of input device 308 include a mouse, a keyboard, a stylus, or a keypad.

Output device 312 may be a liquid crystal display (LCD) device, a plasma display device, a light emitting diode (LED) display device, or a cathode ray tube (CRT) display device. Examples of output interface 310 include a video controller that drives output device 312 to display one or more images based on instructions received from processing unit 302. Processing unit 302 may access the techniques, described herein, for implementing tristate signaling by using encapsulated unidirectional signals, from memory device 304 or from a remote memory device (not shown), similar to memory device 304, via network 314, and executes the techniques. Processing unit 302, memory device 304, network interface 306, input device 308, output interface 310, and output device 312 communicate with each other via a bus 316. In an alternative embodiment, system 300 may not include network interface 306.

Figure 4:
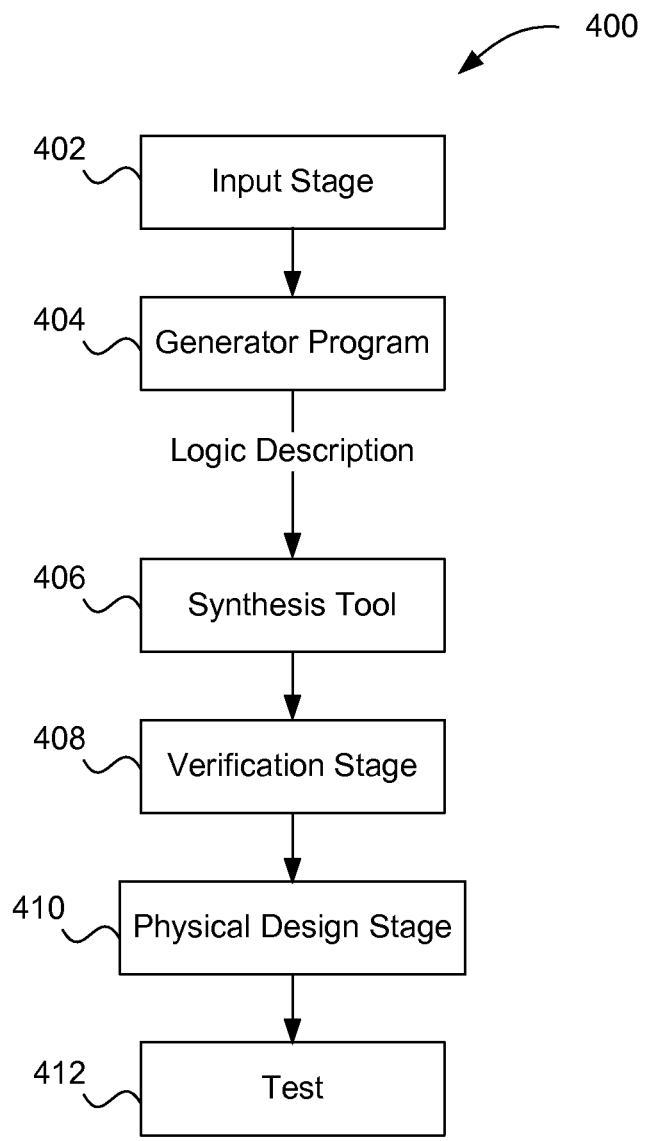
FIG. 4 is a diagrammatic representation showing a technique executed using the system of FIG. 3 to design the PLD.

FIG. 4 is a diagrammatic representation showing a technique 400 executed using system 300 (FIG. 3) to design PLD 200 (FIG. 2). An input stage 402 receives selection information typically from a user for logic, such as, a processor core as well as other components such as a streaming output device to be implemented on PLD 200 (FIG. 2). In one example, an input received is in the form of a high-level language program.

In one example, input stage 402 often allows selection and parameterization of components to be used on PLD 200 (FIG. 13). Input stage 402 also allows configuration of variable or fixed latency support. In some examples, multiple modules provided to an input stage 402 include intellectual property functions, megafunctions, and intellectual property cores. Input stage 402 may be a graphical user interface (GUI) using wizards for allowing efficient or convenient entry of information. Input stage 402 may also be a text interface or a program reading a data file such as a spreadsheet, database table, or schematic to acquire selection information. Input stage 402 produces an output containing information about the various modules selected.

A generator program 404 creates a logic description, such as a hardware description language (HDL) file, from information received via input stage 402 and provides the logic description along with other customized logic to any of a synthesis tool 406, place and route programs, and logic configuration tools to allow a logic description to be implemented on PLD 200 (FIG. 2).

In typical implementations, generator program 404 can identify the selections of modules and generate a logic description with information for implementing the various modules. Generator program 404 can be a Perl script creating HDL files, such as, Verilog™, Abel™, Very High Speed Integrated circuit HDL (VHDL), and Altera™ HDL (AHDL) files, from the module information entered by the user.

Generator program 404 also provides information to synthesis tool 406 to allow HDL files to be automatically synthesized. In some examples, a logic description is provided directly by the user. Hookups between various components selected by the user are also interconnected by generator program 404. Some of the available synthesis tools are Leonardo Spectrum™, available from Mentor Graphics™ Corporation of Wilsonville, Oregon and Synplify™ available from Synplicity™ Corporation of Sunnyvale, Calif. The HDL files may contain technology specific code readable by synthesis tool 406.

Input stage 402, generator program 404, and synthesis tool 406 can be separate programs. The interface between the separate programs can be a database file, a log, or simply messages transmitted between the programs. For example, instead of writing a file to storage, such as memory device 304 (FIG. 3), input stage 402 can send messages directly to generator program 404 to allow the generator program 404 to create a logic description. Similarly, generator program 404 can provide information directly to synthesis tool 406 instead of writing HDL files. Similarly, input stage 402, generator program 404, and synthesis tool 406 can be integrated into a single program.

The user may select various modules and an integrated program can then take the user selections and output a logic description in the form of a synthesized netlist without intermediate files. According to other embodiments, a logic description is a synthesized netlist such as an Electronic Design Interchange Format Input File (EDF file). An EDF file is one example of a synthesized netlist file that can be output by synthesis tool 406.

Synthesis tool 406 can take HDL files and output EDF files. Synthesis tool 406 allows the implementation of the logic design on PLD 200 (FIG. 2).

A verification stage 408 typically follows an application of synthesis tool 406. Verification stage 408 checks the accuracy of the logic deign of PLD 200 (FIG. 2) to ensure that an intermediate or final design realizes any requirements expected the user. Verification stage 408 typically includes simulation tools, functional verification tools, and timing analysis tools for timing verification. Tools for simulation allow the application of inputs and the observation of outputs without having to implement PLD 200 (FIG. 13). Simulation tools provide the user with cost effective and efficient mechanisms for both functional and timing verification of a design of PLD 200 (FIG. 2). Functional verification involves the circuit's logical operation independent of timing considerations. Parameters such as gate delays are disregarded.

Timing verification involves the analysis of the design's operation with timing delays. Setup, hold, and other timing requirements for sequential devices, such as, flip-flops, within a design of PLD 200, are confirmed. Some available simulation tools include Synopsys VCS™, VSS, and Scirocco™, available from Synopsys™ Corporation of Sunnyvale, Calif. and Cadence NC-Verilog™ and NC-VHDL™ available from Cadence Design Systems™ of San Jose, Calif.

After verification stage 408, the synthesized netlist file can be provided to a physical design stage 410 including the place and route phase and configuration tools. The place and route phase typically locates logic cells on specific logic elements of PLD 200 (FIG. 2) and connects wires between the inputs and outputs of various logic elements of the PLD 200 in accordance with logic required to implement an electronic design. PLD 200 (FIG. 2) can also be physically tested at 412.

For programmable logic devices, a programmable logic configuration stage can take the output of the place and route phase to program PLD 200 (FIG. 2) with the user selected and parameterized modules. According to various embodiments, the place and route phase and the logic configuration stage are provided in a Quartus™ Development Tool, available from Altera™ Corporation.

As noted above, different stages and programs can be integrated in a variety of manners. According to one embodiment, input stage 402, generator program 404, synthesis tool 406, verification stage 408, and physical design stage 410 are integrated into a single program, such as the SOPC Builder. The various stages are automatically run using system 300 (FIG. 3) and transparent to the user. Technique 400 can receive the user selected modules, generate a logic description depicting logic for implementing the various selected modules, and implement PLD 200 (FIG. 2). As will be appreciated by one of skill in the art, HDL files and EDF files are mere examples of a logic description. Other file formats as well as internal program representations are other examples of a logic description.

During input stage 402, processing unit 302 receives, from the user, via input device 308, a first set of multiple roles of multiple unidirectional signals to be communicated within integrated circuit 102. Examples of roles within the first set include read, write, address, data, chip select, and byte enable. A read role of a unidirectional signal indicates to tristate system 110 that upon receiving a read user command, a read signal 708 is to be communicated to off-chip device 104 by tristate system 110 to read data from off-chip device 104. A write role of a unidirectional signal indicates to tristate system 110 that upon receiving a write user command, a write signal is to be communicated to off-chip device 104 to write data to off-chip device 104. An address role of a unidirectional signal indicates to tristate system 110 that upon receiving a read or write user command, an address signal is to be communicated to off-chip device 104 to read from or write to an address within off-chip device 104. An address is received in a user command. A data role of a unidirectional signal indicates to tristate system 110 that upon receiving a read command, a data signal is to be received by tristate system 110 from off-chip device 104. Moreover, a data role of a unidirectional signal indicates to tristate system 110 that upon receiving a write command, a data signal is to be communicated by tristate system 110 to off-chip device 104.

A chip select role of a unidirectional signal indicates to tristate system 110 that upon receiving a read user command or a write user command, a chip select signal is to be communicated to off-chip device 104 to select chip 126 to communicate with off-chip device 104 via pin 114, link 118, and pin 122. A byte-enable role of a unidirectional signal indicates to tristate system 110 that upon receiving a read user command or a write user command, a particular byte, such as 8 most significant bits (MSBs) or 8 least significant bits (LSBs), of data signals communicated between tristate system 110 and off-chip device 104 are to be enabled for reception by tristate system 110 or by off-chip device 104.

A second set of roles of a unidirectional signal further includes a prefix and a suffix. A prefix of a unidirectional signal includes a name, such as an HDL name or an EDL name, identifying pin 114 or pin 116 used as a route to communicate the unidirectional signal in the form of a tristate signal and a suffix of the unidirectional signal indicates a state of the unidirectional signal. Examples of a prefix include 'foo', 'moo', and 'omm'. Examples of a suffix include '_out', '_in', and '_outen'. Examples of a state include whether the signal is an input signal to be input from off-chip device 104 to integrated circuit 102 to be received by master controller 108 via tristate system 110, an output signal to be output from integrated circuit 102 to off-chip device 104 to be communicated by master controller 108 via tristate system 110 to off-chip device 104, or an output enable signal that enables the output of the output signal from integrated circuit 102 to off-chip device 104. A unidirectional signal that is provided a role of the first set, the second set, or both the first and second sets by the user via input device 308 is an encapsulated unidirectional signal. The user places the first set of roles with respect to the second set of roles by appending, via input device 308, the second set of roles to the first set of roles or placing, via input device 308, the second set of roles preceding the first set of roles.

In addition to receiving first and second sets of roles of a unidirectional signal, processing unit 302 may receive during input stage 402, via input device 308, from the user, a width of a unidirectional signal. A width of a unidirectional signal is a number of tristate or unidirectional pins, such as multiple data pins D0-D7 of tristate system 110, used to communicate data signals with off-chip device 104.

Table I, provided below, shows examples of a signal role of the first set based on a suffix of the role and a pintype of a pin extending from chip 106.

TABLE I

| ROLE | | | PIN |
|------|------|--------|------|
| *_out | *_in | *_outen | TYPE |
| X | X | X | Tristate |
| X |   | X | Tristate |
| X |   |   | Output |
|   | X |   | Input |

In Table I, '*' represents a name, such as an HDL name or an EDL name, of pin 114 or pin 116. A name of a pin is a prefix of a role of the second set. A pintype of a pin, such as pin 114 or pin 116 (FIG. 1), is tristate if the pin communicates a tristate signal. A pintype of a pin is input if the pin receives an input signal from off-chip device 104 to be input to a component of integrated circuit 102 of chip 106 from which the pin extends and if the pin does not communicate a tristate signal. A pintype of a pin is output if the pin communicates an output signal sent to off-chip device 104 from a component of integrated circuit 102 of chip 106 from which the pin extends.

The user can associate, via input device 308, the combination of suffixes in Table I with a specific prefix. For example, processing unit 302 receives from the user via input device 308, an association between suffixes '_out', '_in', and '_outen' with a prefix 'foo'. The user declares functionality of pin 114 providing the same prefix, which is a name, such as an HDL name or an EDL name, of the pin 114 and different suffixes, such as '_out', '_in', and '_outen', associated with the prefix. An encapsulated unidirectional signal, 'foo_in' receives a current value of pin 114 and another encapsulated unidirectional signal 'foo_outen' controls whether yet another encapsulated unidirectional signal 'foo_out' is output via pin 114 to off-chip device 104. The current value of pin 114 is received from off-chip device 104. As another example, processing unit 302 receives from the user via input device 308, an association between suffixes '_out' and '_outen' with a prefix 'foo'.

Accordingly, the techniques for implementing tristate signaling by using encapsulated unidirectional signals formalizes a representation of a tristate signal as encapsulated unidirectional on-chip signals. The techniques for implementing tristate signaling by using encapsulated unidirectional signals recognize that a tristate signal can be represented as three separate unidirectional signals, such as an input signal, an output signal, and an output enable signal, and the techniques encode this meta-information within technique 400.

Within the SOPC Builder, a unidirectional signal has multiple fields, such as a name, a width, a direction, and a role. Within the role field, the techniques for implementing tristate signaling by using encapsulated unidirectional signals implement constraints to group associated unidirectional signals interacting with pin 114. The implementation of this grouping is performed by appending multiple suffixes to a prefix to create multiple roles.

In one embodiment, if the user does not provide a prefix and/or a suffix, processing unit 302 prompts the user, via output device 312 to provide the suffix and/or prefix.

Figure 5:
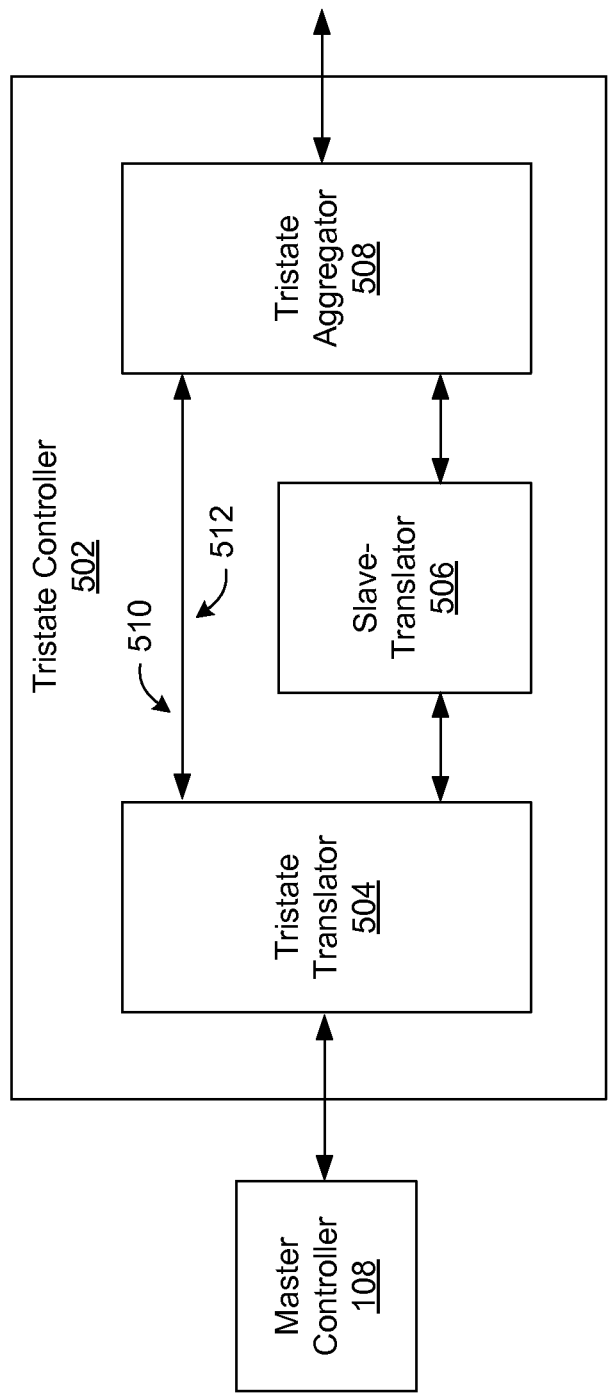
FIG. 5 is a block diagram of an embodiment of a tristate controller located within the tristate system of FIG. 1.

FIG. 5 is a block diagram of an embodiment of a tristate controller 502 that is located within tristate system 110 (FIG. 1). Tristate controller 502 includes a tristate translator 504, a slave translator 506, and a tristate aggregator 508. Slave translator 506 is a timing generation module.

Tristate translator 504 receives a user command from master controller 108 and translates, such as converts, the user command into encapsulated unidirectional signals, such as encapsulated data, address, and control signals, which have a protocol compatible with slave translator 506, to output a translated signal. For example, tristate translator 504 converts a user command compatible with an Avalon™ specification or a MicroBlaze™ specification into a signal compatible with a protocol used by slave translator 506. As another example, upon receiving a read user command in a protocol compatible with master controller 108, tristate translator 504 outputs a read signal, an address signal, a chip select signal, and a byte enable signal to slave translator 506, and receives a data input signal from off-chip device 104, and the signals are compatible with a protocol followed by slave translator 506. As another example, upon receiving a write user command in a protocol compatible with master controller 108, tristate translator 504 outputs a write signal, an address signal, a data output signal, a chip select signal, and a byte enable signal to slave translator 506 and the signals are compatible with a protocol followed by slave translator 506.

Figure 6:
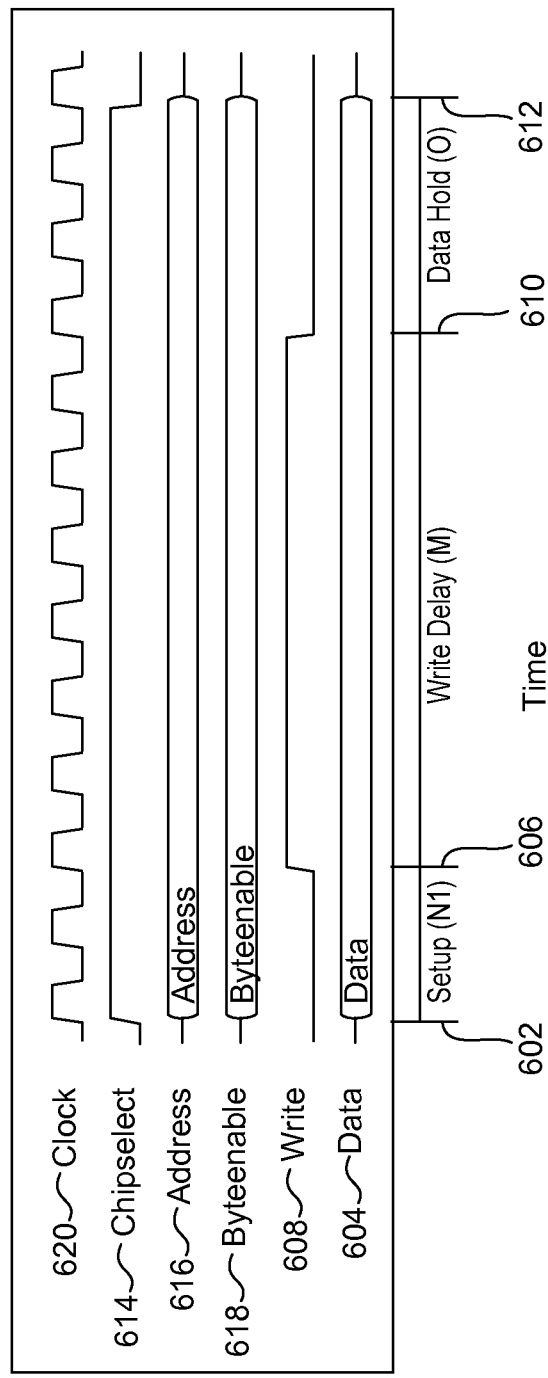
FIG. 6 is an embodiment of a timing diagram of multiple signals associated with a slave translator of the tristate controller during a write transaction.

Slave translator 506 receives multiple translated signals from tristate translator 504 and controls a parameter of the signals. A parameter may include a timing relation between a first translated signal output from slave translator 506 and a second translated signal output from the slave translator 506. For example, as shown in FIG. 6, slave translator 506 determines and inserts a setup delay (N1) between a time 602 at which a valid data signal 604 arrives at slave translator 506 and a time 606 at which a write signal 608 is asserted to start writing data of data signal 608 to off-chip device 104. As another example, as shown in FIG. 6, slave translator 506 determines and inserts a write delay (M) between time 606 at which write signal 608 is asserted to start writing data of data signal 608 to off-chip device 104 and a time 610 at which the write signal 608 is deasserted to end the write of data. As yet another example, as shown in FIG. 6, slave translator 506 determines and inserts a data hold delay (O) between time 610 at which an end of writing data to off-chip device 104 occurs and a time 612 at which data signal 608 becomes invalid. As another example, slave translator 506 determines and changes a time period between assertion and deassertion of a chip select signal 614 that indicates particular chip 126 of off-chip device 104 to which data of data signal 608 is to be written to. As yet another example, slave translator 506 determines and changes a time period between validation and invalidation of an address signal 616 that indicates an address of a memory location within off-chip device 104 to which data of data signal 608 is to be written to. As still another example, slave translator 506 determines and changes a time period between validation and invalidation of a byte enable signal 618 that indicates to off-chip device 104 whether a particular byte of data of data signal 608 is to be written to off-chip device 104.

The setup delay N1, the write delay M, and the data hold delay O may be provided to processing unit 302 via input device 308. Each delay is a time period. The data hold delay O is a time period for which data signal is held, such as stored, in a memory (not shown), of slave translator 506, after deassertion of write signal 608, to be written to off-chip device 104. A valid signal is a signal if information, such as an address or data, within the valid signal can be interpreted by slave translator 506. An invalid signal is a signal if the information within the signal cannot be interpreted by slave translator 506.

During a write transaction initiated when a write user command is issued by master controller 108, slave translator 506 asserts write signal 608 N1 clock cycles after receiving valid data signal 604, valid address signal 616, asserted chip select signal 614, and write signal 608 from tristate translator, and holds the write signal 608 and chip select signal 614 as constant and address signal 616 and byte enable signal 618 as valid for M clock cycles after assertion of the write signal 608, deasserts the write signal 608 M clock cycles after assertion of the write signal 608, and holds the data signal 604, address signal 616, and byte enable signal 618 as valid and the chip select signal 614 as constant for O clock cycles after deasserting the write signal 608 and before each of the address signal 616, byte enable signal 618, and data signal 604 becomes invalid and the chip select signal 614 becomes deasserted.

Slave translator 506 receives a clock signal 620 from a clock signal generator, such as an oscillator (not shown) connected to a phase lock loop (PLL) (not shown), and chip select signal 614, address signal 616, byte enable signal 618, write signal 608, and data signal 604 are synchronous with clock signal 620. As shown in FIG. 6, each of chip select signal 614, address signal 616, byte enable signal 618, write signal 608, and data signal 604 span, such as is asserted or valid, over multiple clock cycles of clock signal 620.

Each of chip select signal 614, address signal 616, byte enable signal 618, write signal 608, and data signal 604 are output from slave translator 506 to tristate aggregator 508.

Figure 7:
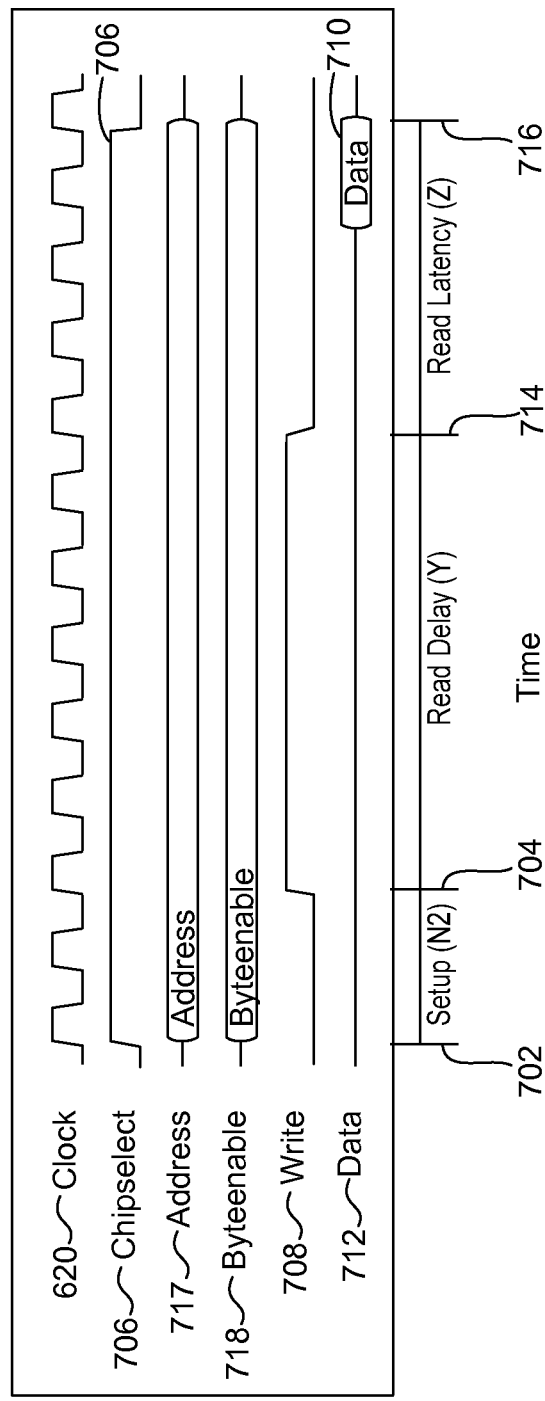
FIG. 7 is an embodiment of a timing diagram of multiple signals associated with the slave translator during a read transaction.

Another example of a control of a parameter by slave translator 506 is illustrated using FIG. 7. As shown in FIG. 7, slave translator 506 determines and inserts a setup delay (N2) between a time 702 at which an asserted chip select signal 706 arrives at slave translator 506 and a time 704 at which a read signal 708 is asserted to start reading data 710 of a data signal 712 from off-chip device 104. Data 710 is a valid part of data signal 712. As yet another example, as shown in FIG. 7, slave translator 506 determines and inserts a read delay (Y) between time 704 at which read signal 708 is asserted to start reading data signal 712 from off-chip device 104 and a time 714 at which the read signal 708 is deasserted to end the reading of data signal 712. As still another example, as shown in FIG. 7, slave translator 506 determines and inserts a read latency (Z) as a delay between time 714 and a time 716 at which data 710 read from off-chip device 104 is received by slave translator 506. As another example, slave translator 506 changes a time period between assertion and deassertion of chip select signal 706 that indicates particular chip 126 of off-chip device 104 to which data 710 is to be read from. As yet another example, slave translator 506 determines and changes a time period between validation and invalidation of an address signal 717 that indicates an address of a memory location within off-chip device 104 from which the data 710 is to be read. As still another example, Slave translator 506 determines and changes a time period between validation and invalidation of a byte enable signal 718 that indicates to off-chip device 104 whether a particular byte of data 710 of data signal 712 is to be read from off-chip device 104. The setup delay N2, the read delay Y, and the read latency Z may be provided to processing unit 302 via input device 308.

During a read transaction initiated when a read use command is issued by master controller 108, slave translator 506 asserts read signal 708 N2 clock cycles after receiving valid chip select signal 706, data signal 712, valid address signal 717, valid byteenable signal 718, and read signal 708 from tristate translator 504, holds chip select signal 706 and read signal 708 as constant and each of address signal 717 and byte enable signal 718 as valid for Y clock cycles after asserting the read signal 708, deasserts the read signal 708 after Y clock after asserting the read signal 708, holds the chip select signal 706 and read signal 708 as constant and address signal 717 and byte enable signal 718 as valid for Z clock cycles after deasserting the read signal 708 and holds data 710 as valid until the end of the Zth clock cycle. At the end of the Zth cycle, the chip select signal 706 becomes deasserted, and the address signal 717 and the byteenable signal 718 become invalid.

Each of chip select signal 706, address signal 717, byte enable signal 718, and read signal 708 is output from slave translator 506 to output to tristate aggregator 508 and data signal 712 is received by slave translator 506 from off-chip device 104 via tri-state aggregator 508.

Figure 8:
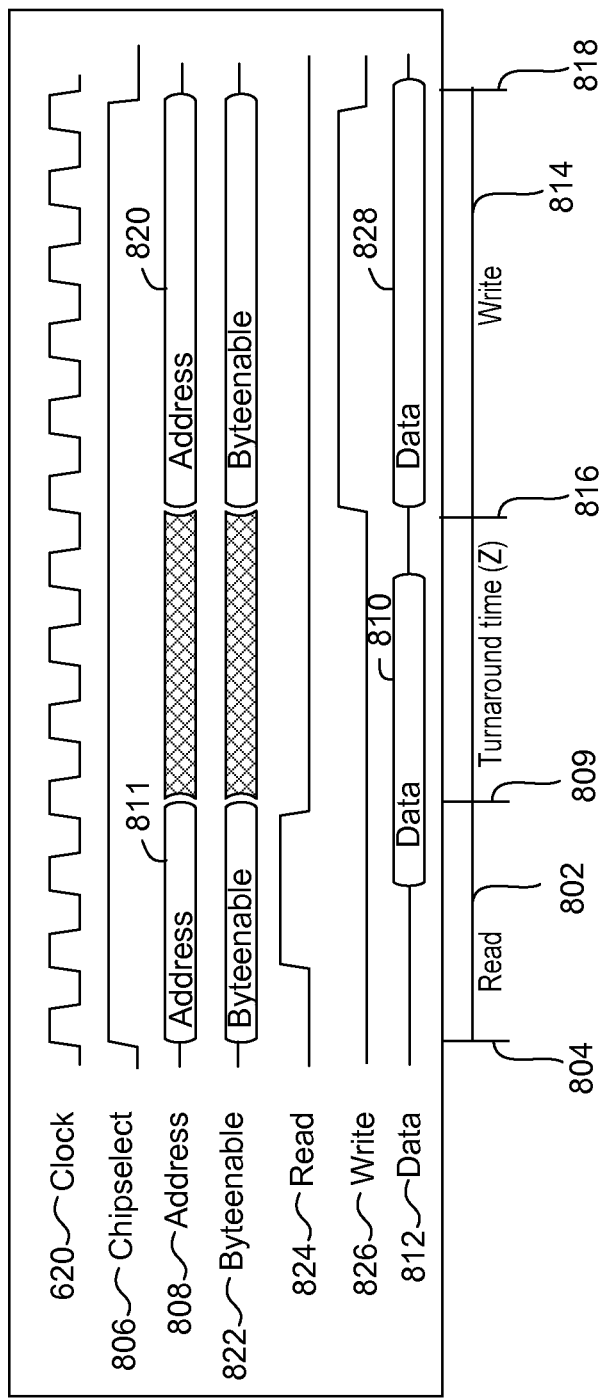
FIG. 8 is an embodiment of a timing diagram of multiple signals associated with the slave translator during a write and a read transaction.

Another example of control of a parameter by slave translator 506 is illustrated using FIG. 8. As shown in FIG. 8, slave translator 506 controls a read cycle delay 802 that is time period between a time 804 a chip select signal 806 is asserted to select particular chip 126 of off-chip device 104 and a time 809 an address signal 808 having an address 811 of a memory location within off-chip device 104 from which data 810, of a data signal 812, to be read becomes invalid.

As yet another example, as shown in FIG. 8, slave translator 506 controls a write cycle delay 814, which is a time period between a time 816 at which address signal 808 becomes valid again after becoming invalid at time 809 and a time 818 at which the address signal 808 becomes invalid again after becoming valid at time 816. When address signal 808 becomes valid at time 804 for a first time, the information within the address signal 808 includes address 811 of a memory location, within off-chip device 104, from which data 810, of data signal 812, is to be read. When address signal 808 becomes valid at time 816 for a second time after the first time, the information within the address signal 808 includes an address 820 of a memory location, within off-chip device 104, to which data 828, of data signal 812, is to be written.

By controlling read cycle delay 802 and write cycle delay 814, slave translator 506 controls a turnaround time (Z) between the read cycle delay 802 and the write cycle delay 814. The turnaround time delay Z occurs between times 809 and 816. The turnaround time delay Z prevents bus contention on pin 114. During the turnaround time delay Z, both address signal 808 and a byte enable signal 822 are invalid. Moreover, during the turnaround time delay Z, a read signal 824 and a write signal 826 are deasserted.

Each of chip select signal 614 (FIG. 6) and chip select signal 706 (FIG. 7) is an example of a chip select signal 806. Moreover, each of address signal 616 (FIG. 6) and address signal 717 (FIG. 7) is an example of address signal 808. Each of byte enable signal 618 (FIG. 6) and byte enable signal 718 (FIG. 7) is an example of byte enable signal 822. Furthermore, read signal 708 (FIG. 7) is an example of read signal 824 and write signal 608 (FIG. 6) is an example of write signal 826.

Each of chip select signal 806, address signal 808, byte enable signal 822, read signal 824, write signal 826, and data 828 of data signal 812 is output from slave translator 506 to tristate aggregator 508 and data 810 is received by slave translator 506 from off-chip device 104.

In an alternative embodiment, the systems and methods described herein do not include byte enable signal and/or chip select signals 614 and 706 (FIGS. 6 and 7). In various other embodiments, chip select signal 614, address signal 616, byte enable signal 618, write signal 608, and/or data signal 604 span, such as are asserted or valid, over multiple clock cycles of clock signal 620. In various other embodiments, chip select signal 706, address signal 706, byte enable signal 718, read signal 708, and/or data signal 712 span, such as are asserted or valid, over multiple clock cycles of clock signal 620.

In another alternative embodiment, it is noted that the write cycle delay 814 comes before the turnaround Z and the read cycle delay 802 comes after the turnaround time Z.

In various embodiments, the setup delays N1 and N2, the write delay M, the data hold delay O, the read delay Y, the read latency Z, the read cycle delay 802, the turnaround time delay Z, and the write cycle delay 814 are provided to processing unit 302 by the user via input device 308. In other embodiments, the setup delays N1 and N2, the write delay M, the data hold delay O, the read delay Y, the read latency Z, the read cycle delay 802, the turnaround time delay Z, and the write cycle delay 814 are provided to processing unit 302 by the user during input stage 402 via input device 308.

Referring back to FIG. 5, tristate aggregator 508 receives a request signal 510 issued by tristate translator 504 and/or receives multiple slave translator output signals output from slave translator 506, and may change a polarity of request signal 510 and/or one or more of the slave translator output signals to output one or more aggregator output signals. Tristate aggregator 508 changes a negative polarity into a positive polarity and changes a negative polarity into a positive polarity. Examples of slave translator output signals include chip select signal 604, chip select signal 706, byte enable signal 618, byte enable signal 718, data signal 604, write signal 608, address signal 616, and address signal 717. Request signal 510 is further described below.

The user specifies, via input device 308 to processing unit 302, whether a polarity of a particular signal, such as request signal 510 or a slave translator output signal, received by tristate aggregator 508 is to be changed. For example, the user specifies, during input stage 402, whether a polarity of a particular signal received by tristate aggregator 508 is to be changed. Examples of signals received by tristate aggregator 508 are listed in Table II below.

TABLE II

| SIGNAL | INVERTIBLE |
| --- | --- |
| Address | No |
| Data | No |
| Byte Enable | Yes |
| Write Byte enable | Yes |
| Write | Yes |
| Read | Yes |
| Begin Transfer | Yes |
| Chip Select | Yes |
| Arbiterlock | Yes |
| Output Enable | Yes |
| Reset Request | Yes |

Each address signal 616, 717, and 808 (FIGS. 6-8) is an example of the address signal listed in Table II and each data signal 604, 712, and 812 (FIGS. 6-8) is an example of the data signal listed in Table II. Each byte enable signal 618, 718, and 822 (FIGS. 6-8) is an example of the byte enable signal listed in Table II and each write signal 608 and 826 (FIGS. 6 and 8) is an example of the write signal listed in Table II. Each read signal 708 and 824 (FIGS. 7 and 8) is an example of the read signal listed in Table II and each chip select signal 604, 716, and 806 (FIGS. 6-8) is an example of the chip select signal listed in Table II. The write byte enable signal listed in Table II is a signal output from slave translator 506 by ANDing the byte enable listed in Table II and the write signal listed in Table II. The Begin Transfer signal listed in Table II is a signal communicated between tristate system 110 and off-chip device 104 to begin a data transfer between tristate aggregator 508 and the off-chip device 104. The Arbiterlock signal listed in Table II is a signal communicated by tristate system 110 to off-chip device 104 to maintain arbitration of tristate controller 502 independent of whether data is communicated between tristate controller 502 and off-chip device 104.

The output enable signal listed in Table II is a signal communicated by tristate system 110 to off-chip device 104 to indicate to off-chip device 104 to enable communication of data between tristate controller 502 and off-chip device 104. The reset request signal 510 listed in Table II is a signal communicated by off-chip device 104 to tristate system 110 to reset the tristate system 110. The wait request signal 510 listed in Table II is a signal communicated by off-chip device 104 to tristate system 110 to indicate that the off-chip device 104 is busy and that data cannot be communicated between tristate system 110 and off-chip device 104.

The interrupt request signal 510 listed in Table II is a signal communicated by off-chip device 104 to tristate system 110 to interrupt an operation performed by the tristate system 110. A particular signal is listed as being invertible ("Yes") in Table II means that tristate aggregator 508 can change a polarity of the signal. Otherwise, a particular signal is not invertible ("No").

Some types of off-chip device 104 use a protocol that specifies communicating signals in a negative polarity and some other types of off-chip device 104 use a protocol that specifies communicating signals in a positive polarity. By providing tristate aggregator 508 that changes a polarity of a slave translator output signal, tristate controller 502 is made compatible with different types of off-chip device 104.

By rewriting a design of tristate controller 502 and tristate aggregator 508 via technique 400, the user can customize tristate controller 502 and signals output from the tristate controller 502 while retaining the remaining of the design of integrated circuit 102. This allows tristate controller 502 to extend to multiple protocols used by off-chip device 104 to communicate with integrated circuit 102.

It is noted that in various embodiments, tristate aggregator 508 can change a polarity of address and data signals listed in Table II. In an alternative embodiment, the address signal listed in Table II is invertible and in yet another alternative embodiment, the data signal listed in Table II is invertible.

Figure 9:
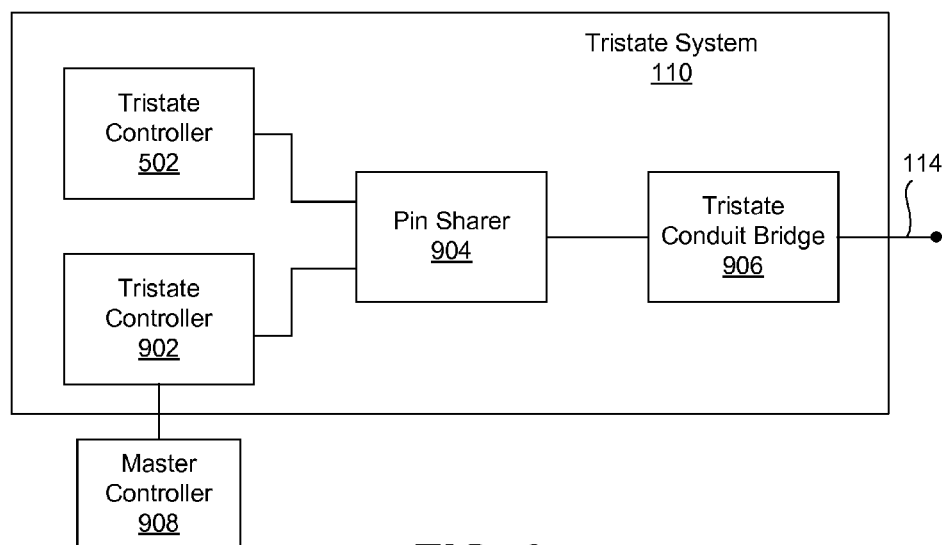
FIG. 9 is a block diagram of another embodiment of the tristate system.

FIG. 9 is a block diagram of another embodiment of tristate system 110. Tristate system 110 includes tristate controller 502, another tristate controller 902 that is similar to tristate controller 502, a pin sharer module 904, and a tristate conduit bridge 906. Tristate conduit bridge 906 is an exemplary I/O device 202 (FIG. 2). Tristate controller 902 is similar to tristate controller 502 in that tristate controller 902 includes a tristate converter (not shown), a slave translator (not shown), and a tristate aggregator (not shown). Tristate controller 902 is coupled to another master controller 908. Master controller 908 may be a NIOS II™ processor available from Altera™ corporation, a processor that uses Avalon™ switching fabric as an interface to apply the Avalon™ specification, a MicroBlaze™ processor available from Xilinx™ corporation, or an ARM™ processor that uses an AHB interface to apply the AHB specification.

Tristate aggregator 508 (FIG. 5) outputs a plurality of aggregator output signals to pin sharer module 904 based on a user command received from master controller 108 (FIG. 1). Similarly, the tristate aggregator (not shown) of tristate controller 902 outputs a plurality of aggregator output signals to pin sharer module 904 based a user command received from master controller 908.

Pin sharer module 904 receives aggregator output signals from tristate controller 502 and aggregator output signals from tristate controller 902, and multiplexes the aggregator output signals received from tristate controller 502 with aggregator output signals output from tristate controller 902 to output pin sharer module output signals. For example, pin sharer multiplexes an encapsulated unidirectional output enable signal, having a suffix "_outen", output from tristate aggregator 508 (FIG. 5) with an encapsulated unidirectional output enable signal, having a suffix "_outen" output from the tristate aggregator (not shown) of tristate controller 902. As another example, pin sharer module 904 multiplexes an encapsulated unidirectional output signal, having a suffix "_out", output from tristate aggregator 508 (FIG. 5) with an encapsulated unidirectional output signal, having a suffix "_out" output from the tristate aggregator (not shown) of tristate controller 902.

Pin sharer module 904 aggregates output signals received from tristate aggregator 508 (FIG. 5) and with aggregator output signals received from the tristate aggregator (not shown) of tristate controller 902 to allow pin 114 to be shared by multiple tristate controllers 502 and 902 and master controllers 108 and 908. As such, pin sharer module 904 provides arbitration between tri-state controller 502 and tri-state controller 902 to prevent collisions from occurring on pin 114.

Pin sharer module 904 does not multiplex an aggregator output signal that is received from tristate aggregator 508 and that has a different suffix, of the second set, than a suffix, of the second set, of an aggregator output signal received from the tristate aggregator (not shown) of tristate controller 902. For example, pin sharer module 904 does not multiplex an encapsulated unidirectional input signal having a suffix "_in" and received from tristate aggregator 508 (FIG. 5) with an encapsulated unidirectional output signal having a suffix "_out" and received from the tristate aggregator (not shown) of tristate controller 902. As another example, pin sharer module 904 does not multiplex an encapsulated unidirectional output enable signal having a suffix "_outen" and received from tristate aggregator 508 (FIG. 5) with an encapsulated unidirectional output signal having a suffix "_out" and received from the tristate aggregator (not shown) of tristate controller 902. As yet another example, pin sharer module 904 does not multiplex an encapsulated unidirectional input signal having a suffix "_in" and received from tristate aggregator 508 (FIG. 5) with an encapsulated unidirectional output enable signal having a suffix "_outen" and received from the tristate aggregator (not shown) of tristate controller 902.

Moreover, pin sharer module 904 receives request signal 510 from tristate translator 504 (FIG. 5) via tristate aggregator 508 and another request signal from the tristate translator (not shown) of tristate controller 902 via the tristate aggregator (not shown) of the tristate controller 902, and arbitrates between the two request signals to provide access to pin 114 to only one of the request signals. Request signal 510 is generated by tristate translator 504 to execute a user command from master controller 108 to access pin 114 and similarly, the other request signal is generated by the tristate translator of tristate controller 902 to execute a user command from master controller 908 to access pin 114. If a request of a request signal 510 is granted via a grant signal 512, master controller 108 gains access to pin 114 and if a request of the other request signal is granted via another grant signal, master controller 908 gains access to pin 114.

Tristate controller 502 that obtains access to pin 114 asserts request signal 510 until N clock cycles before the tristate controller 502 completes using pin 114 to access off-chip device 104 for reading data from or writing data to the off-chip device 104. N is a real number greater than zero. For example, N is one or two. Therefore, the other request signal received from tristate controller 902 is pipelined by pin sharer module 904 by N clock cycles and represents intention of tristate controller 902 to access pin 114 not during a current clock cycle but during an immediately following clock cycle. The current clock cycle precedes the immediately following clock cycle.

Pin sharer module 904 does not preempt tristate controller 502 that currently accesses pin 114 to access off-chip device 104 upon receiving the other request signal from tristate controller 902 because such interruption of tristate controller 502 could produce unexpected results. Instead, tristate controller 502 can fairly access pin 114 by deasserting request signal 510 at a safe access point, and reasserting request signal 510 N clock cycles after the safe access point to restart arbitration with tristate controller 902. An example of a safe access point is N clock cycles before an end of a read or write transaction. During a read transaction, data is read by master controller, such as master controller 108 or master controller 908, from off-chip device 104 via pin 114 and during a write transaction, data is written to off-chip device 104 via pin 114 by the master controller. A read transaction ends when a master controller, such as master controller 108 of master controller 908, has finished reading data from off-chip device 104 and a write transaction ends when the master controller has finished writing the data to off-chip device 104.

Because tristate controller 502 deasserts request signal 510 an $N^{th}$ clock cycle before tristate controller 502 completes accessing pin 114, tristate controller 902 can assert the other request signal during the $N^{th}$ clock cycle preceding an $(N+1)^{th}$ clock cycle during which tristate controller 902 asserts the other request signal, and the assertion of the other request signal is performed to be considered in arbitration during the $(N+1)^{th}$ clock cycle. By asserting the other request signal during the $N^{th}$ clock cycle, tristate controller 902 obtains access to pin 114 during the $(N+1)^{th}$ clock cycle if tristate controller 502 does not request access during the $(N+1)^{th}$ clock cycle after deasserting request signal 510. Otherwise, if tristate controller 902 does not assert the other request signal during the $N^{th}$ clock cycle, tristate controller 502 may request access to pin 114 during an $(N+1)^{th}$ clock cycle immediately following the $N^{th}$ clock cycle and gains access to pin 114 during an $(N+2)^{th}$ clock cycle. The $(N+1)^{th}$ clock cycle precedes the $(N+2)^{th}$ clock cycle. In this manner, tristate controller 502 can yield to tristate controller 902 requesting arbitration for access to pin 114 and not lose access to pin 114 if tristate controller 902 does not request access to pin 114.

When arbitration is won by tristate controller 502, pin sharer module 904 receives grant signal 512 from tristate conduit bridge 906. Grant signal 512 may be a loop back of request signal 510. Master controller 108 receives a version of grant signal 512 from pin sharer module 904 via tristate aggregator 508 and tristate translator 504.

Pin sharer module 904 outputs, as a multiplexed signal, an aggregator output signal output from tristate controller 502 at a time the tristate controller 502 is winning arbitration and outputs, as the multiplexed signal, an aggregator output signal output from tristate controller 902 at a time the tristate controller 502 is winning arbitration. A multiplexed signal output from pin sharer module 904 is a pin sharer module output signal.

Figure 10:
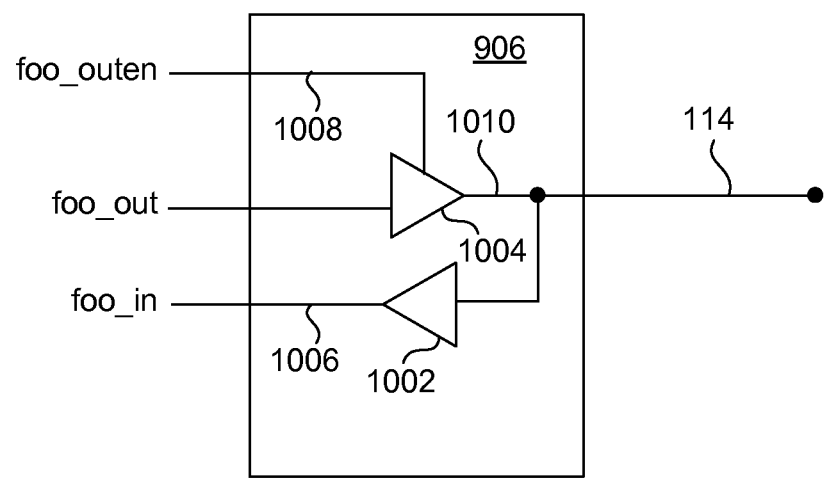
FIG. 10 is an embodiment of a circuitry of a tristate conduit bridge of the tristate system of FIG. 9.

Tristate conduit bridge 906 receives pin sharer module output signals, which are multiplexed unidirectional signals, from pin sharer module 904, and generates tristate signals from the unidirectional signals based on a prefix, of the second set, of the signals. For example, tristate conduit bridge 906, illustrated in FIG. 10, determines whether a prefix, such as 'foo', of the second set, of a slave translator output signal multiplexed within a pin sharer module output signal is the same as a prefix, 'foo', of a slave translator output signal multiplexed within the pin sharer module output signal, and upon determining that the prefixes are the same, tristate conduit bridge 906 generates a tristate signal by combining the slave translator output signals having the same prefix, and communicates the tristate signal via pin 114 identified by the prefix to off-chip device 104. In this example, the slave translator output signals are generated based on a user command of master controller 108 or 908 currently winning arbitration. As another example, tristate conduit bridge 906 combines a first slave translator output signal multiplexed within a pin sharer module output signal, a second slave translator output signal multiplexed within the pin sharer output signal, and a third slave translator output signal multiplexed within the same pin sharer output signal by determining that the first slave translator output signal has the same prefix, of the second set, as prefixes of the second and third slave translator output signals. Moreover, in this example, the first slave translator output signal has a role of input as indicated by a suffix 'in' of the first slave translator output signal, the second slave translator output signal has a role of output enable as indicated by a suffix '_outen' of the second slave translator output signal, and the third slave translator output signal has a role of output as indicated by a suffix '_output' of the third slave translator output signal. Tristate conduit bridge 906 combines the first, second, and third slave translator output signals to output a tristate signal via pin 114. Moreover, in this example, tristate conduit bridge 906 combines first slave translator output signal with second and third slave translator output signals by communicating the first slave translator output signal via an output 1006 of a buffer 1002, communicating the second slave translator output signal via an enable input 1008 of a buffer 1004, and communicating the third slave translator output signal via an output 1010 of buffer 1004.

As another example, tristate conduit bridge 906 does not combine the first slave translator output signal with the second or third slave translator output signal by determining that the first slave translator output signal has a different prefix, of the second set, than a prefix of the second or third slave translator output signal.

Tristate conduit bridge 906 communicates a tristate signal via output 1010 of buffer 1004, pin 114, link 118, and pin 122, to off-chip device 104. Each buffer 1002 and 1004 is a logic gate and is located within tristate conduit bridge 906. Accordingly, when prefixes of signal roles, of the second set, of first, second, and third slave translator output signals match but suffixes of the three signals are different, tristate conduit bridge 906 determines that all the three signals represent a tristate signal, which is to be communicated via pin 114, link 118, and pin 122, to off-chip device 104. A tristate signal is a signal input to buffer 1002 at a time an output enable signal is not asserted via enable input 1008 and is a signal output from buffer 1004 at a time the output enable signal is asserted.

At a time the second slave translator output signal is communicated to enable input 1008 of buffer 1004, buffer 1004 outputs the third slave translator output signal via pin 114 to off-chip device 104. Moreover, at a time the second slave translator output signal is not communicated to enable input 1008 of buffer 1004, buffer 1002 outputs the first slave translator output signal via output 1006 and the first slave translator output signal is output by buffer 1002 upon receiving an input signal from off-chip device 104 via pin 114.

Tristate conduit bridge 906 determines to communicate a tristate signal via pin 114 instead of via pin 116 by determining that a name, such as an HDL name or an EDL name, of pin 114 matches a prefix of the first, second, and third slave translator output signals. A name of pin 114 is different than a name of pin 116. Names of pins 114 and 116 are assigned during input stage 402 via input device 308 by the user.

The first slave translator output signal has a direction of communication, such as an output direction, opposite to a direction of communication, such as an input direction, of the third slave translator output signal. The first slave translator output signal is communicated from off-chip device 104 to integrated circuit 102 and the third slave translator output signal is communicated from the integrated circuit 102 to off-chip device 104.

All signals communicated internally within integrated circuit 102 are unidirectional. Tristate conduit bridge 906 that exists immediately before physical pins 114 and 116 provides a conversion between a unidirectional signal and a bidirectional, such as a tristate, signal. Tristate conduit bridge 906 is able to determine an association between multiple on-chip unidirectional signals and a tristate signal communicated via pin 114.

In an alternative embodiment, pin sharer module 904 multiplexes an aggregator output signal that is received from tristate aggregator 508 and that has a different suffix, of the second set, than that of an aggregator output signal received from the tristate aggregator (not shown) of tristate controller 902.

In another alternative embodiment, master controller 908 is located within tristate system 110. In yet another alternative embodiment, tristate system 110 does not include pin sharer module 904. In such a case, tristate conduit bridge 906 directly receives slave translator output signals output from slave translator 506.

In an alternative embodiment in which an input signal cannot be received by buffer 1002 to output the first slave translator output signal, tristate conduit bridge 906 determines to combine the second slave translator output signal with the third slave translator output signal to output a tristate signal via pin 114 to off-chip device 104. In such embodiment, the third slave translator output signal is output from output 1010 of buffer 1004 if the second slave translator output signal is asserted via enable input 1008 and if the second slave translator output signal is not asserted via the enable input 1008, the third slave translator output signal is not output from output 1010. In this embodiment, tristate conduit bridge 906 does not combine the second slave translator output signal with the third slave translator output signal by determining that the second slave translator output signal has a different prefix, of the second set, than a prefix of the third slave translator output signal.

The techniques, described herein, for implementing tristate signaling by using encapsulated unidirectional signals provide a tristate conduit interface specification by formalizing a specification. The formalization is performed to identify groups of unidirectional signals, such as a group of the input, output enable, and output signals and the unidirectional signals are encoded, such as encapsulated, to identify a tristate signal communicated via pin 114. Accordingly, the systems and techniques, described herein, for implementing tristate signaling by using encapsulated unidirectional signals provide a manner of formalization of the specification in addition to integrating meta-information, such as the association between the unidirectional signals and a tristate signal, into technique 400, which is a system integration tool. By formalizing the specification, a standard way is provided to the user who may also be an author declaring and manipulating unidirectional signals on-chip.

Moreover, multiple encapsulated unidirectional signals that represent a tristate signal are manipulated on-chip by slave translator 506 by changing a parameter as described above. In addition, various components of integrated circuit 102 communicate on-chip using unidirectional signals to avoid speed, complexity, and cost issues associated with on-chip tristate signaling. Integrated circuit 102 prevents the user, who may be an integrated circuit 102 designer, from performing any on-chip modification of tristate signals without being aware of three distinct unidirectional signals making a tristate signal communicated via pin 114.

The systems, described herein, for implementing tristate signaling by using encapsulated unidirectional signals having a hierarchical system design that converts between encapsulated unidirectional signals and a tristate signal. When a system is flat, which is not hierarchical, multiple tristate signals are allowed to propagate from multiple components to multiple bidirectional pins and do not cross hierarchical boundaries. The tristate conduit interface specification allows the user that does not have direct control over an on-chip tristate signal to provide control of on-chip unidirectional signals and to allow a tristate signal to propagate over pin 114 in a particular manner, such as for example, in a manner controller by slave translator 506.

Further, in the systems and techniques for implementing tristate signaling by using encapsulated unidirectional signals, there is no limitation placed on a number or functionalities of unidirectional on-chip signals. For example, the first set of roles of unidirectional signals are not limited to address, data, read, and write. Rather, signal roles of the first set can be extended to include additional signal roles, such as read address strobe, ready, and busy to accommodate off-chip device 104 that may use these additional signal roles. Because the tristate conduit interface specification does not restrict functionality of signals generated based on a user command issued by master controller 108, logic and signaling that is used to control and communicate with off-chip device 104 can be implemented.

Additionally, an on-chip master controller, such as master controller 108 or master controller 908, is not forced to be held in a waiting state while the master controller wins arbitration to access off-chip device 104 via a pin, such as pin 114 or 116, and until an access to off-chip device 104 is complete. The systems for implementing tristate signaling by using encapsulated unidirectional signals include a tristate controller 502, such as tristate controller 502 or tristate controller 902, that acts as an intermediary to manage data flow to off-chip device 104. A master controller, such as master controller 108 or master controller 908, issues a user command to a corresponding tristate controller, such as tristate controller 502 or tristate controller 902, without forcing the master controller to wait for an access to off-chip device 104 to complete. A tristate controller, such as tristate controller 502 or 902, handles the task of arbitrating access to pin 114 without involving the corresponding master controller, such as master controller 108 or master controller 908. It is noted that master controller 108 corresponds to tristate controller 502 and master controller 908 corresponds to tristate controller 902. Accordingly, master controller 108 or master controller 908 does not need to wait to initiate a transaction with off-chip device 104.

The tristate conduit interface specification is employed by integrated circuit 102 to emit, manipulate, or translate discrete unidirectional signals into a tristate signal. Tristate controller 502 encapsulates a unidirectional signal, interfaces with master controller 108 and off-chip device 104, and handles communication between the master controller 108 and off-chip device 104. Tristate controller 502 may provide priority access to master controller 108 or queue user commands received from master controller 108 to take advantage of batch access from and to off-chip device 104.

Tristate controller 502 allows the user to specify a timing relation between address, control, and data signals via multiple parameters, such as a parameter that defines a polarity of a signal or an instantiation of a signal. As an example, a parameter is statically set by the user so that the parameter cannot be changed at a time integrated circuit 102 is implemented in a field. In an alternative embodiment, a parameter is dynamically set by the user so that the parameter can be changed at a time integrated circuit 102 is implemented in the field. An example of a field implementation includes operating integrated circuit 102 in a cell phone or a computer. As another example, a parameter is dynamically set if the user can connect a computer to the cell-phone to change the parameter.

The systems and processes for implementing tristate signaling by using encapsulated unidirectional signals describe collections of related unidirectional signals pertaining to pin 114 and the description enables the user to increase his/her productivity and reduce complexity of a design of integrated circuit 102.

Although the foregoing systems and techniques have been described in detail by way of illustration and example for purposes of clarity and understanding, it will be recognized that the above described systems and techniques may be embodied in numerous other specific variations and embodiments without departing from the spirit or essential characteristics of the systems and techniques. Certain changes and modifications may be practiced, and it is understood that the systems and techniques are not to be limited by the foregoing details, but rather is to be defined by the scope of the appended claims.

The invention claimed is:

1. An integrated circuit for implementing tristate signaling, said integrated circuit comprising a tristate system configured to convert an encapsulated unidirectional signal into a tristate signal, the encapsulated unidirectional signal being a unidirectional signal that is provided, by a user, via an input device:
    at least one role selected from a first set including one or more of read, write, address, data, chip select, and byte enable, and
    at least one role selected from a second set consisting of a prefix, and a suffix;
the tristate system comprising:
    a tristate translator that converts a user command into the encapsulated unidirectional signal; and
    a slave translator connected to the tristate translator; wherein:
    said slave translator is configured to control a parameter including a timing relation between a control signal, an address signal, and a data signal or a delay between a read transaction and a write transaction.

2. The integrated circuit of claim 1, wherein said tristate system is configured to communicate the tristate signal over a bidirectional physical pin.

3. The integrated circuit of claim 2, wherein the bidirectional physical pin is configured to communicate an output signal in a first direction and an input signal in a second direction opposite to the first direction.

4. The integrated circuit of claim 1, wherein the tristate system comprises a conduit bridge configured to convert the encapsulated unidirectional signal into the tristate signal.

5. The integrated circuit of claim 1, wherein the encapsulated unidirectional signal includes an input signal that travels in a first direction, an output signal that travels in a second direction opposite to the first direction, or an output enable signal that enables a communication of the output signal.

6. The integrated circuit of claim 1, wherein said tristate translator is configured to translate a signal compatible with a protocol into a signal compatible with said slave translator or is configured to issue a request signal.

7. The integrated circuit of claim 1, wherein said tristate system further comprises a tristate aggregator connected to the slave translator and the tristate translator, said tristate aggregator being configured to change a polarization of a signal received from said tristate translator or said slave translator.

8. The integrated circuit of claim 1, wherein said tristate system comprises a conduit bridge configured to convert the encapsulated unidirectional signal into the tristate signal.

9. The integrated circuit of claim 1, wherein said tristate system comprises a pin sharer module configured to multiplex a signal from the tristate controller and another signal from another tristate controller.

10. The integrated circuit of claim 1, wherein said tristate system is configured to convert a collection of encapsulated unidirectional signals into the tristate signal.

11. A method for implementing tristate signaling in an integrated circuit, said integrated circuit comprising a tristate system being configured to convert an encapsulated unidirectional signal into a tristate signal and comprising a tristate translator that converts a user command into the encapsulated unidirectional signal, and a slave translator connected to the tristate translator, said method comprising:
    converting, with the tristate system, an encapsulated unidirectional signal into a tristate signal, the encapsulated unidirectional signal being a unidirectional signal that is provided, by a user, via an input device:
        at least one role selected from a first set including one or more of read, write, address, data, chip select, and byte enable, and
        at least one role selected from a second set consisting of a prefix, and a suffix; and
    controlling, with the slave translator, a parameter including a timing relation between a control signal, an address signal, and a data signal or a delay between a read transaction and a write transaction.

12. The method of claim 11, further comprising communicating the tristate signal over a bidirectional physical pin.

13. The method of claim 12, wherein said communicating the tristate signal comprises communicating an output signal in a first direction and an input signal in a second direction.

14. The method of claim 11, wherein the encapsulated unidirectional signal includes an input signal that travels in a first direction, an output signal that travels in a second direction opposite to the first direction, or an output enable signal that enables a communication of the output signal.

15. The method of claim 11, wherein said converting the encapsulated unidirectional signal into the tristate signal is performed by a tristate system including a tristate translator, a slave translator, and a tristate aggregator, said method further comprising:
    translating a signal compatible with a protocol into a signal compatible with the slave translator; or
    issuing a request signal.

16. The method of claim 15, further comprising changing a polarization of a signal received from the tristate translator or the slave translator.

17. The method of claim 11, further comprising:
    dynamically changing the parameter at a time the integrated circuit is implemented in a field.

18. The method of claim 11, wherein said converting comprises converting a collection of encapsulated unidirectional signals into the tristate signal.

19. An integrated circuit for implementing tristate signaling, said integrated circuit comprising:
    a tristate system being configured to convert an encapsulated unidirectional signal into a tristate signal; and
    means for converting an encapsulated unidirectional signal into a tristate signal and communicating the tristate signal over a bidirectional physical pin, the encapsulated unidirectional signal being a unidirectional signal that is provided, by a user, via an input device;
        at least one role selected from a first set including one or more of read, write, address, data, chip select, and byte enable, and
        at least one role selected from a second set consisting of a prefix, and a suffix;
    wherein the tristate system comprises means for controlling a parameter including a timing relation between a control signal, an address signal, and a data signal or a delay between a read transaction and a write transaction.

20. The integrated circuit of claim 19, wherein the bidirectional physical pin is configured to communicate an output signal in a first direction and an input signal in a second direction opposite to the first direction.

21. The integrated circuit of claim 19, wherein the encapsulated unidirectional signal includes an input signal that travels in a first direction, an output signal that travels in a second direction opposite to the first direction, or an output enable signal that enables a communication of the output signal.

22. The integrated circuit of claim 19, further comprising means for converting a collection of encapsulated unidirectional signals into the tristate signal.

* * * * *